United States Patent
Fukushima (10) Patent No.: US 7,881,119 B2
(45) Date of Patent: Feb. 1, 2011

(54) CURRENT SENSING CIRCUIT AND SEMICONDUCTOR MEMORY DEVICE INCLUDING THE SAME

(75) Inventor: Nobuyuki Fukushima, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 99 days.

(21) Appl. No.: 12/385,958

(22) Filed: Apr. 24, 2009

(65) Prior Publication Data

US 2009/0268538 A1 Oct. 29, 2009

(30) Foreign Application Priority Data

Apr. 25, 2008 (JP) .............................. 2008-116148

(51) Int. Cl.
*G11C 16/06* (2006.01)
(52) U.S. Cl. .................... 365/185.21; 365/207; 365/222
(58) Field of Classification Search .............. 365/185.2, 365/185.21, 189.07, 189.08, 189.09, 205, 365/207, 210
See application file for complete search history.

(56) References Cited

U.S. PATENT DOCUMENTS 6,621,729 B1* 9/2003 Garni et al. .................. 365/158
6,950,341 B2* 9/2005 Takano et al. ........... 365/185.21
2006/0050584 A1* 3/2006 Gogl et al. ................... 365/207
2008/0002481 A1* 1/2008 Gogl et al. ............. 365/189.06

FOREIGN PATENT DOCUMENTS

JP 2003-331599 11/2003

* cited by examiner

*Primary Examiner*—Gene N. Auduong
(74) *Attorney, Agent, or Firm*—McGinn IP Law Group, PLLC (57) ABSTRACT

To provide a current sensing circuit that detects a difference between a cell current and a reference current. The current sensing circuit includes: current mirror circuits of which the input terminal is connected with a reference current source; a differential amplifier of which the one input terminal is supplied with a potential of an electrical connection point between an output terminal of the current mirror circuit and a memory cell and of which the other input terminal is supplied with a reference potential; and an equalizing circuit that short-circuits the both input terminals of the differential amplifier in response to an equalizing signal. Thereby, the both input terminals can be kept at the same potential immediately before a sensing operation starts, and thus, even when the cell current is weak, a highly sensitive sensing operation can be performed at high speed.

20 Claims, 9 Drawing Sheets

CURRENT SENSING CIRCUIT AND SEMICONDUCTOR MEMORY DEVICE INCLUDING THE SAME

BACKGROUND OF THE INVENTION

1. Field of the Invention

The present invention relates to a current sensing circuit and a semiconductor memory device including the same, and, more particularly relates to a current-mirror type current sensing circuit and a semiconductor memory device including the same.

2. Description of Related Art

Currently, there are various types of semiconductor memory devices, and DRAM (Dynamic Random Access Memory) can be mentioned as a representative thereof. In DRAMs, information is stored by an amount of charges stored in a cell capacitor. Therefore, in DRAMs, a voltage-sensing type sense amplifier is used.

Meanwhile, in semiconductor memory devices such as flash memory, EEPROM, PRAM (Phase Change Random Access Memory), and RRAM (Resistive Random Access Memory), information is stored by way of an electrical resistance (or conduction/non-conduction) of a memory cell. Thus, as a sense amplifier of this type of semiconductor memory device, a current-sensing type sense amplifier is used (see Japanese Patent Application Laid-open No. 2003-331599).

Figure 8:
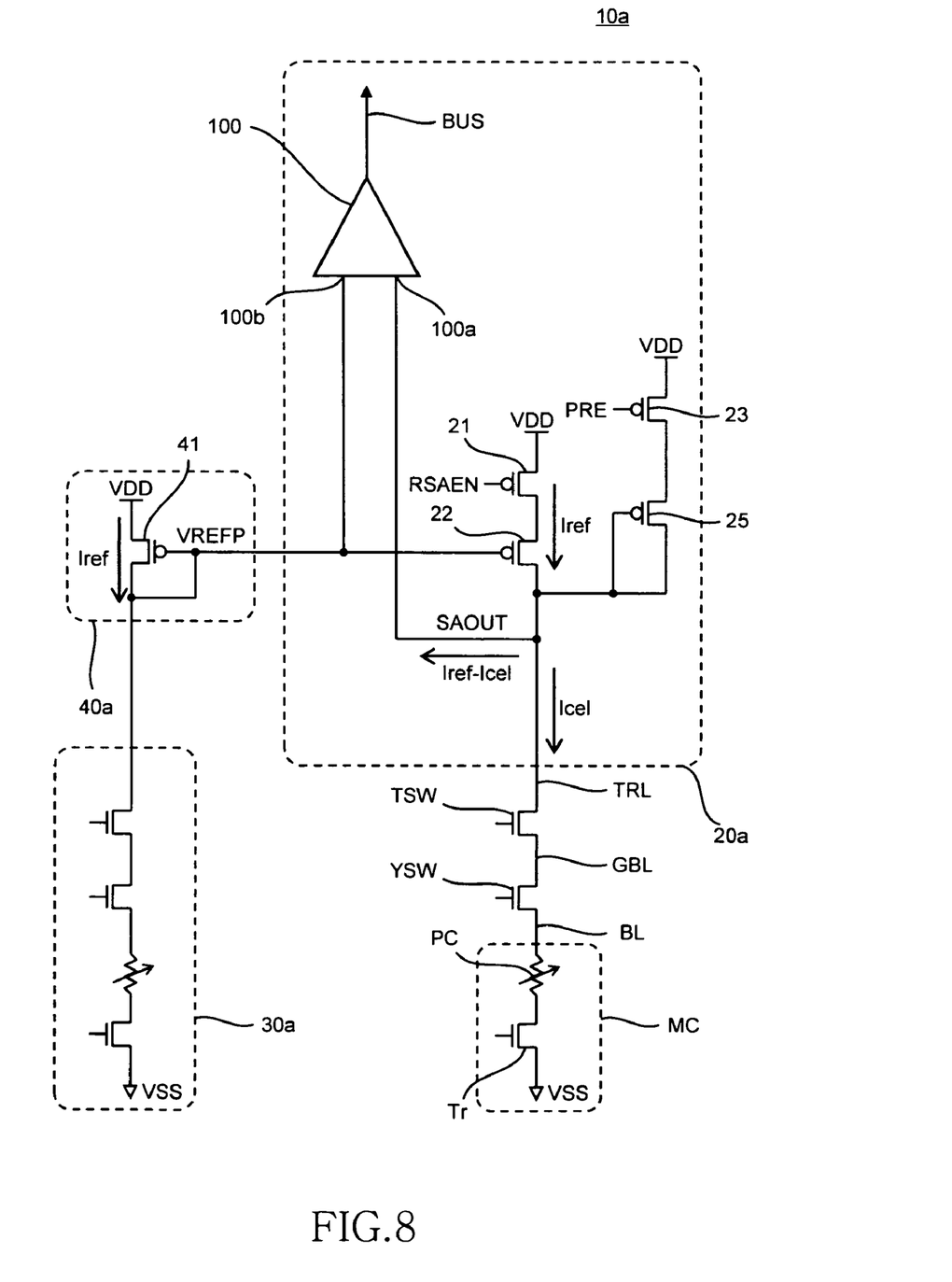

FIG. 8 is a circuit diagram of a conventional current sensing circuit including a current-sensing type sense amplifier.

A current sensing circuit 10a shown in FIG. 8 is configured by a sense amplifier 20a, a reference cell 30a, and a reference amplifier 40a. The sense amplifier 20a includes a differential amplifier 100 of which one input terminal 100a is connected to a transfer line TRL. The transfer line TRL is connected to a global bit line GBL via a transfer switch TSW, and the global bit line GBL is connected to a bit line BL via a column switch YSW. The bit line BL is connected with a memory cell MC. In an example shown in FIG. 8, the memory cell MC is a PRAM cell composed of a phase-change memory device PC and a selection transistor Tr.

The reference cell 30a has the same circuit configuration as that from the transfer line TRL to the memory cell MC, and generates a reference current Iref. The reference current Iref is supplied to the reference amplifier 40a. The reference amplifier 40a has a P-channel MOS transistor 41 of which the gate and the drain are short-circuited, and accordingly, potentials of the gate and the drain of the transistor 41 are stabled to a level (VREFP) obtained by subtracting a threshold value voltage of the transistor 41 from a power supply potential VDD. The reference potential VREFP is supplied to an input terminal 100b of the differential amplifier 100.

As shown in FIG. 8, the sense amplifier 20a further includes P-channel MOS transistors 21 and 22 connected in series between the power supply potential VDD and the transfer line TRL. A gate of the transistor 21 is supplied with a sense-amplifier activating signal RSAEN, and a gate of the transistor 22 is supplied with the reference potential VREFP.

According to such a configuration, a current mirror circuit is configured in which the transistor 41 is an input transistor and the transistor 22 is an output transistor. Accordingly, when the sense-amplifier activating signal RSAEN is activated, the reference current Iref flows to the transistor 22 (when a current mirror ratio is 1:1).

The sense amplifier 20a includes a precharge transistor 23 that is turned on in response to a precharge signal PRE and a diode-connected transistor 25.

Figure 9:
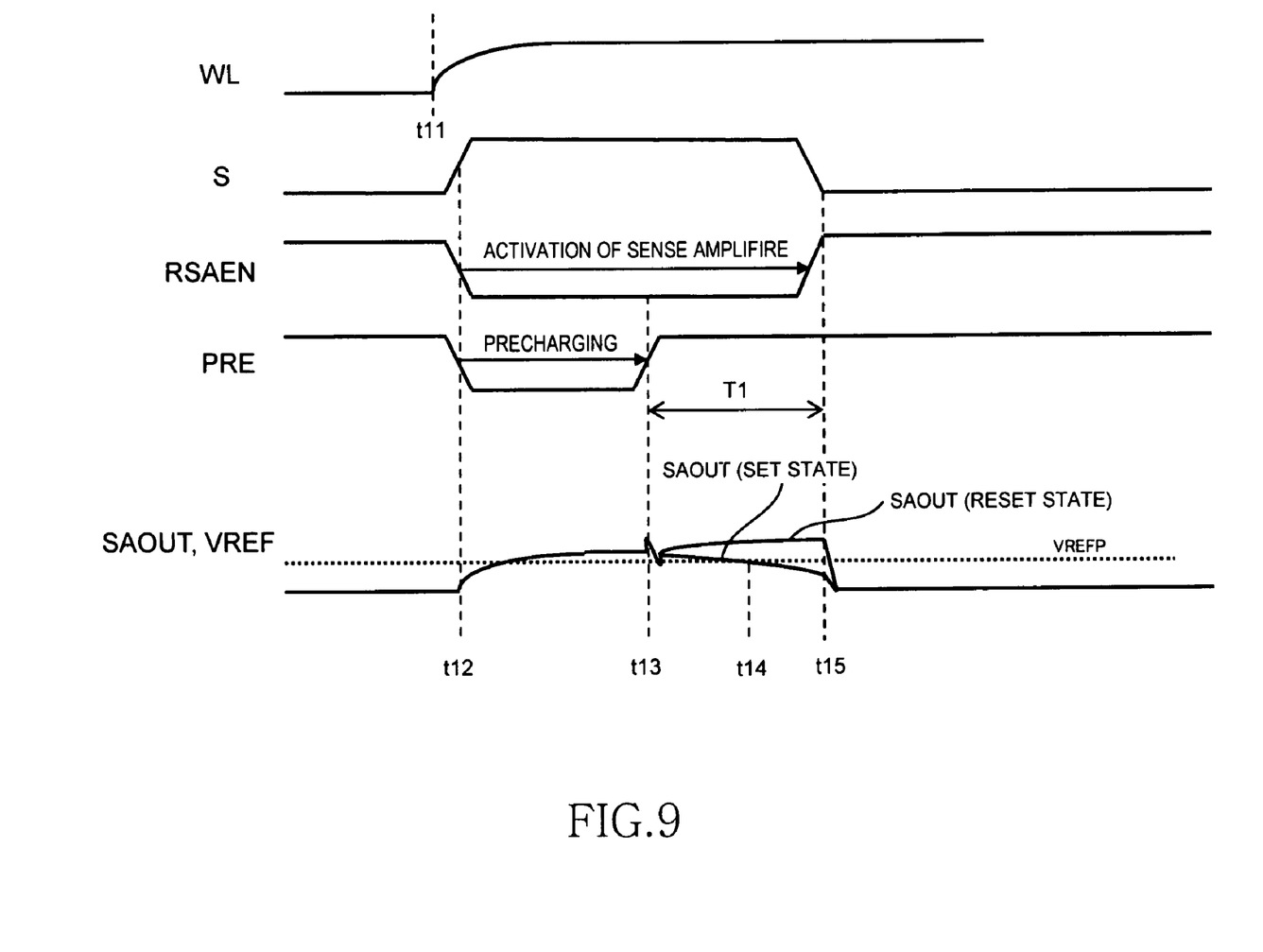

FIG. 9 is a timing chart for explaining an operation of the current sensing circuit 10a.

As shown in FIG. 9, when a predetermined word line is selected at time t11, a transfer-switch selection signal S, a sense-amplifier activating signal RSAEN, and the precharge signal PRE are activated at subsequent time 12. Thereby, the selected memory cell MC is connected to the transfer line TRL, and also, a potential SAOUT of the input terminal 100a of the differential amplifier 100 reaches a level obtained by subtracting a threshold value voltage of the transistor 25 from the power supply potential VDD. On the other hand, the input terminal 100b of the differential amplifier 100 is directly connected to the current mirror circuit, and thus its potential is VREFP.

The reference potential VREFP supplied to the input terminal 100b is a level obtained by subtracting a threshold value voltage of the transistor 41 from the power supply potential VDD. Thus, when the transistor 25 and the transistor 41 completely match in threshold value, SAOUT and VREFP correctly match in level. However, in reality, there exits a manufacture variation, and thus it is difficult to completely match the threshold values of these transistors. Thus, in reality, SAOUT and VREFP are precharged in an offset state. An example shown in FIG. 9 shows a state that SAOUT is slightly highly precharged as compared to the reference potential VREFP. Needless to mention, there can be an opposite state.

At time 13, the precharge signal PRE is inactivated, and the precharge transistor 23 is turned off. As a result, a precharge operation is completed, and a sense enabled state is established. At this time, by a coupling capacity of the precharge transistor 23, the potential SAOUT of the input terminal 100a is disturbed temporarily and greatly. Such potential fluctuation is one of the causes for offsetting the differential amplifier 100.

Thereafter, the potential SAOUT of the input terminal 100a gradually changes according to a current Icel flowing to the memory cell MC. At time 15, the transfer switch TSW is turned off, and a reading operation from the memory cell MC is ended. At the same time, the sense-amplifier activating signal RSAEN is activated. Thereby, data according to a magnitude relationship between the potential SAOUT and the reference potential VREFP is outputted to a data bus BUS.

However, in the conventional current sensing circuit 10a shown in FIG. 8, SAOUT and VREFP are precharged in an offset state, as described above, and thus it takes a long period of time before an advantageous potential difference occurs between SAOUT and VREF2. It is understood that in the example shown in FIG. 9, even when the memory cell MC is in a set state (a low-resistance state), the levels of SAOUT and VREFP are inverted until time t14. Further, in consideration of the level fluctuation of SAOUT resulting from the coupling capacity of the precharge transistor 23, it is necessary to secure a period T1 (a sensing period) sufficiently long. Thus, there is a problem in the conventional current sensing circuit 10a that the data reading takes time.

Such a problem occurs not only in a current sensing circuit for a PRAM but also in overall current sensing circuits for other semiconductor memory devices such as a current sensing circuit for a flash memory and a current sensing circuit for a RRAM. However, in PRAMs or RRAMs, a cell current is particularly low, and thus the influence exerted by the input offset of the differential amplifier during the data reading time is significantly conspicuous.

SUMMARY

The present invention seeks to solve one or more of the above problems, or to improve upon those problems at least in part.

In one embodiment, there is provided a current sensing circuit comprising: a current mirror circuit having an input terminal and an output terminal, the input terminal of the current mirror circuit being connected to a reference current source; a differential amplifier having a first input terminal and a second input terminal, the first input terminal of the differential amplifier being supplied with a potential of an electrical connection point between the output terminal of the current mirror circuit and a memory cell, and the second input terminal of the differential amplifier being supplied with a reference potential; and an equalizing circuit that short-circuits the first and second input terminals of the differential amplifier in response to an equalizing signal.

In a still another embodiment, there is provided a semiconductor memory device comprising: a memory cell in which a resistance value differs depending on stored data;

a bit line connected to the memory cell; and a current sensing circuit that reads data stored in the memory cell via the bit line, wherein the current sensing circuit includes: a reference current source that flows a reference current; a current mirror circuit having an input terminal and an output terminal, the input terminal of the current mirror circuit is connected to the reference current source; a differential amplifier having a first input terminal and a second input terminal, the first input terminal of the differential amplifier being supplied with a potential of an electrical connection point between the output terminal of the current mirror circuit and the memory cell, and the second input terminal of the differential amplifier being supplied with a reference potential; and an equalizing circuit that short-circuits the first and second input terminals of the differential amplifier in response to an equalizing signal.

According to the present invention, there is an equalizing circuit that short-circuits one input terminal and the other input terminal of a differential amplifier, and thus the both components can be kept at the same potential until immediately before the sensing operation starts. As a result, even when a cell current flowing to a memory cell is weak, a highly sensitive sensing operation can be performed at high speed.

In the present invention, it is preferable to further include a reference-potential supply circuit that is arranged independently of a current mirror circuit and that supplies a reference potential, in which the other input terminal of the differential amplifier is electrically connected to an output of the reference-potential supply circuit. Thus, when the reference-potential supply circuit is arranged separately of the current mirror circuit, it becomes unnecessary to directly retrieve the reference potential from the input terminal of the current mirror circuit. Thereby, the operation of the current mirror circuit is stabled, and thus, even when an amount of a current flowing to the current mirror circuit is set small, a stabled sensing operation can be performed.

In this case, it is preferable to further include a precharge circuit that supplies the reference potential to the one input terminal of the differential amplifier in response to a precharge signal, in which the reference-potential supply circuit includes a reference-potential generating circuit that generates the reference potential and a switch circuit that supplies the reference potential to the other input terminal of the differential amplifier in response to the precharge signal. According thereto, in a period during which the precharge signal is activated, one input terminal and the other input terminal of the differential amplifier are applied the same potential even without using the equalizing circuit. Thus, the both terminals can be promptly and surely kept at the same potential.

In the present invention, it is preferable that the reference-potential supply circuit further includes a capacitive element of which one end is connected to the other input terminal of the differential amplifier. Accordingly, a stabled reference potential can be generated without arranging a constant current source or the like in the reference-potential supply circuit. Further, when the other end of the capacitive element and the source of the memory cell are connected to the same power supply wiring (for example, a GND wiring), even if a source potential of the memory cell fluctuates, the potential of the other end of the capacitive element similarly fluctuates. As a result, the fluctuation of a signal level by a voltage fluctuation becomes a common mode, and thus a current sensing circuit that can withstand the voltage fluctuation can be configured.

As described above, according to the present invention, even when a cell current flowing to a memory cell is weak, a highly sensitive sensing operation can be performed at high speed. Thereby, when a current sensing circuit according to the present invention is applied to a semiconductor memory device, such as a PRAM, which needs to sense a weak current, high-speed data reading can be realized.

BRIEF DESCRIPTION OF THE DRAWINGS

The above features and advantages of the present invention will be more apparent from the following description of certain preferred embodiments taken in conjunction with the accompanying drawings, in which:

FIG. 8 is a circuit diagram of a conventional current sensing circuit 10a; and

FIG. 9 is a timing chart for explaining an operation of the current sensing circuit 10a.

DETAILED DESCRIPTION OF THE EMBODIMENTS

Preferred embodiments of the present invention will be explained below in detail with reference to the accompanying drawings.

Figure 1:
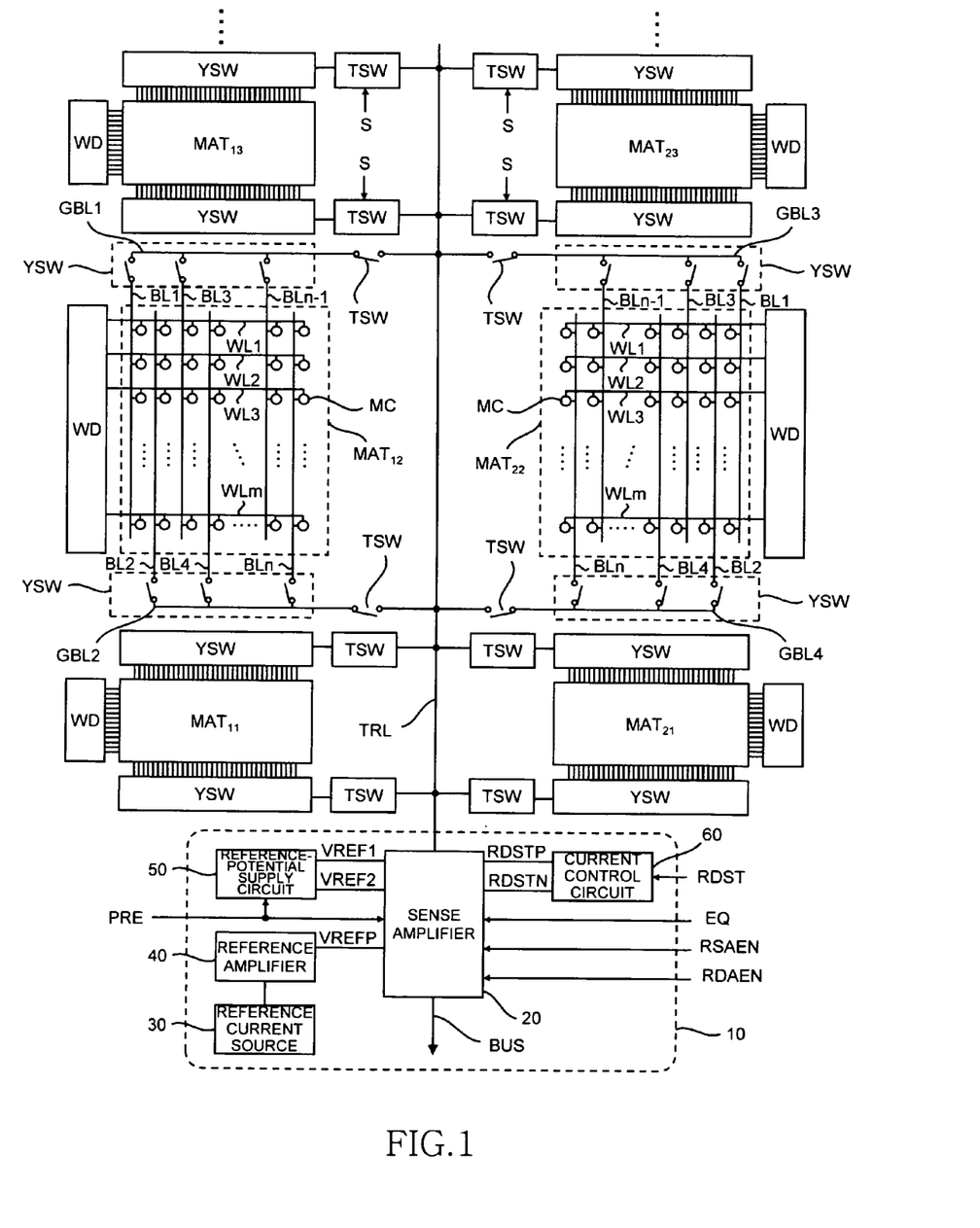
FIG. 1 is a diagram showing a configuration of main parts of a semiconductor memory device according to one embodiment of the present invention.

FIG. 1 shows a configuration of main parts of a semiconductor memory device according to one embodiment of the present invention. In this embodiment, one example in which the present invention is applied to a PRAM is shown.

As shown in FIG. 1, the semiconductor memory device according to the present embodiment includes a plurality of memory mats $MAT_{11}$, $MAT_{12}$, $MAT_{13}$, . . . , and a transfer line TRL commonly assigned to the memory mats. The transfer line TRL is connected to a current sensing circuit 10. The current sensing circuit 10 will be described in detail later.

The memory mats $MAT_{11}$, $MAT_{12}$, $MAT_{13}$, . . . , are all configured by a plurality of word lines WL1 to WLm, a plurality of bit lines BL1 to BLn, and memory cells MC arranged at the intersections. The selection of the word lines WL1 to WLm is performed by a word driver WD, and any one of the word lines WL1 to WLm is activated. The bit lines BL1 to BLn are configured to be connectable to the global bit line GBL via the corresponding column switch YSW.

Figure 2:
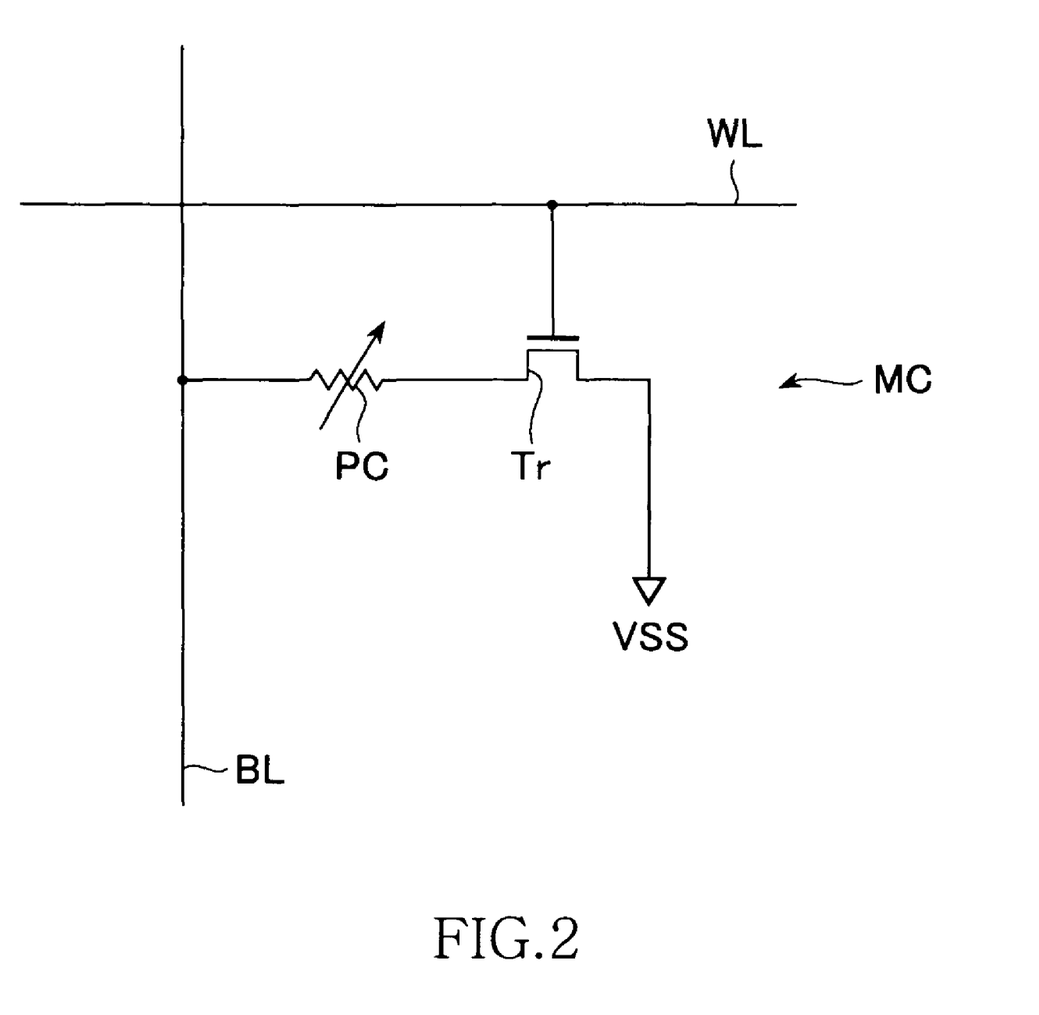
FIG. 2 is a circuit diagram of the memory cell MC.

FIG. 2 is a circuit diagram of the memory cell MC.

As shown in FIG. 2, each memory cell MC is configured by a phase-change memory device PC made of a phase change material and a selection transistor Tr, and these are connected in series between a bit line BL and a source line VSS.

As the phase change material configuring the phase-change memory device PC, any material is not particularly limited as long as it has two or more phase states and differs in electrical resistance depending on each phase state. However, it is preferable to select a so-called chalcogenide material. The chalcogenide material denotes an alloy containing at least one or more elements selected from the group consisting of germanium (Ge), antimony (Sb), tellurium (Te), indium (In), selenium (Se) or the like. Examples thereof include: binary elements such as GaSb, InSb, InSe, $Sb_2Te_3$, and GeTe; ternary elements such as $Ge_2Sb_2Te_5$, InSbTe, GaSeTe, $SnSb_2Te_4$, and InSbGe; and quaternary elements such as AgInSbTe, (GeSn)SbTe, GeSb(SeTe), and $Te_{81}Ge_{15}Sb_2S_2$.

The phase change material containing the chalcogenide material can take either one of an amorphous phase (a non-crystalline phase) and a crystalline phase. The chalcogenide material is in a relatively high resistance state in the amorphous phase, and is in a relatively low resistance state in the crystalline phase.

The selection transistor Tr is configured by an N-channel MOS transistor, and its gate electrode is connected to the corresponding word line WL. Accordingly, when the word line WL is activated, the phase-change memory device PC is connected between the bit line BL and the source line VSS.

To amorphasize (reset) the phase change material, the phase change material is heated by applying thereto a writing current to a temperature equal to a melting point or above, and is then cooled rapidly thereafter. On the other hand, to crystallize (set) the phase change material, the phase change material is heated by applying thereto a writing current to a temperature equal to or above a crystallization temperature and less than the melting point, and thereafter, the temperature is gradually cooled. The application of such a writing current is supplied by a writing circuit (not shown). Note that a data writing operation is not directly relevant to the present invention, and thus explanations thereof will be omitted.

Meanwhile, data reading is performed by connecting the phase-change memory device PC to the bit line BL by turning on the selection transistor Tr, and by sending a reading current in this state. To avoid the occurrence of a phase change, the reading current is set to a value sufficiently smaller than the writing current. Accordingly, unlike DRAMs, the memory cell MC can perform non-destructive reading. A phase state of the phase change material does not change unless high heat is applied, and thus data is not lost even after the power supply is disconnected. The data reading is performed by the current sensing circuit 10 shown in FIG. 1.

Referring back to FIG. 1, the transfer switch TSW is arranged between the global bit line GBL and the transfer line TRL. The transfer switch TSW is turned on/off in response to a transfer-switch selection signal S. Thereby, when a predetermined column switch YSW and a predetermined transfer switch TSW are turned on in a state that any one of the word lines WL is selected, one memory cell MC that is selected is connected to the current sensing circuit 10 via the bit line BL, the global bit line GBL, and the transfer line TRL. In this way, in the semiconductor memory device, one current sensing circuit 10 is commonly used for a large number of bit lines BL. This is due to the following reasons.

That is, in a general semiconductor memory device such as a DRAM, sense amplifiers are allocated to each bit line pair. Accordingly, the sense amplifiers are often located inside a cell array. In the PRAM, however, when data is read, a reading current needs to be applied to the phase-change memory device PC to thereby convert a retained content in the memory cell MC into a potential difference. Further, this potential difference needs to be amplified. As a result, a circuit scale of the sense amplifier of the PRAM becomes much larger than that of the sense amplifier of a DRAM. For these reasons, in the present embodiment, one current sensing circuit 10 is commonly allocated to a large number of bit lines BL.

As shown in FIG. 1, the current sensing circuit 10 is configured by a sense amplifier 20, a reference current source 30, a reference amplifier 40, a reference-potential supply circuit 50, and a current control circuit 60. However, out of the circuit blocks configuring the current sensing circuit 10, a circuit block that is individually needed for one transfer line TRL is only the sense amplifier 20. Other circuit blocks, i.e., the reference current source 30, the reference amplifier 40, the reference-potential supply circuit 50, and the current control circuit 60, can be shared by a plurality of current sensing circuits 10. This feature will be described later.

Figure 3:
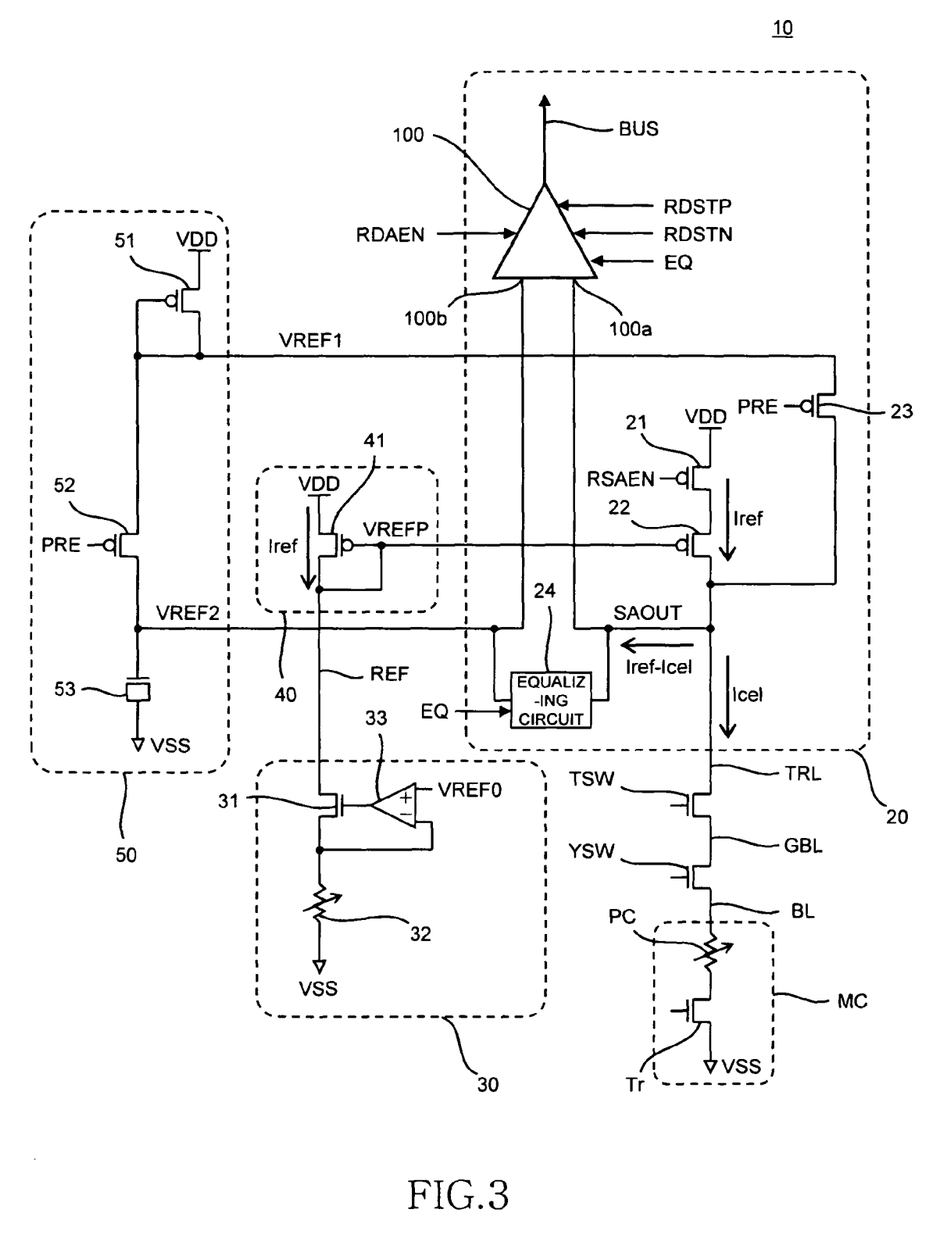
FIG. 3 is a circuit diagram showing a configuration of main parts of the current sensing circuit 10.

FIG. 3 is a circuit diagram showing a configuration of main parts of the current sensing circuit 10, and shows a portion composed of the sense amplifier 20, the reference current source 30, the reference amplifier 40, and the reference-potential supply circuit 50.

As shown in FIG. 3, the sense amplifier 20 includes the differential amplifier 100 of which the input terminal 100a is connected to the transfer line TRL. As shown in FIG. 1, the transfer line TRL is connected to any one of the global bit lines GBL via the transfer switch TSW, and the global bit line GBL is connected to any one of the bit lines BL via the column switch YSW.

The differential amplifier 100 has a pair of input terminals 100a and 100b, and amplifies a potential difference appearing in the input terminals 100a and 100b under the control of the differential amplifier activating signal RDAEN, an equalizing signal EQ, and the reference potentials RDSTP and RDSTN. The reference potentials RDSTP and RDSTN are potentials supplied from the current control circuit 60 shown in FIG. 1.

The reference current source 30 is configured by an N-channel MOS transistor 31 and a variable resistance element 32 connected in series between a reference wiring REF and a source line VSS, and an operation amplifier 33 that controls the transistor 31. An inverted input terminal (−) of the operation amplifier 33 is connected between the transistor 31 and the variable resistance element 32. A non-inverted input terminal (+) of the operation amplifier 33 is supplied with a reference potential VREF0. The reference wiring REF connects the reference current source 30 and the reference amplifier 40.

According to such a configuration, in the reference current source 30, the reference current Iref determined by the level of the reference potential VREF0 and the resistance value of the variable resistance element 32 flows. A value of the reference current Iref is set to a desired current value by adjusting the resistance value of the variable resistance element 32 at the time of manufacturing.

The reference amplifier 40 is configured by the P-channel MOS transistor 41 connected between the power supply potential VDD and the reference wiring REF. Accordingly, in the transistor 41, the reference current Iref generated by the reference current source 30 flows. The gate and the drain of the transistor 41 are short-circuited, and thus potentials of the gate and the drain of the transistor 41 are stabled to a level (VREFP) obtained by subtracting a threshold value voltage of the transistor 41 from the power supply potential VDD. The level of the reference potential VREFP basically matches that of the reference potential (VREF2) that should be supplied to the input terminal 100b of the differential amplifier 100. However, in the present embodiment, the reference potential VREFP is not supplied to the input terminal 100b of the differential amplifier 100. The reason for this will be described later.

As shown in FIG. 3, the sense amplifier 20 further includes P-channel MOS transistors 21 and 22 connected in series between the power supply potential VDD and the transfer line TRL. The gate of the transistor 21 is supplied with the sense-amplifier activating signal RSAEN. On the other hand, the gate of the transistor 22 is connected to the gate and the drain of the transistor 41 configuring the reference amplifier 40.

According to such a configuration, a current mirror circuit in which the transistor 41 is an input transistor and the transistor 22 is an output transistor is configured. Accordingly, when the sense-amplifier activating signal RSAEN is activated, the reference current Iref flows to the transistor 22 (when a current mirror ratio is 1:1). It is not essential that the current mirror ratio is 1:1.

Further, the sense amplifier 20 includes the precharge transistor 23 (precharge circuit) that is turned on in response to the precharge signal PRE. The precharge transistor 23 is connected between the reference-potential supply circuit 50 and the transfer line TRL. Accordingly, when the precharge signal PRE is activated, the transfer line TRL is precharged to a reference potential VREF1.

Further, the sense amplifier 20 includes an equalizing circuit 24 that short-circuits the input terminal 100a and the input terminal 100b of the differential amplifier 100 in response to the equalizing signal EQ. Thereby, when the equalizing signal EQ is activated, the input terminals 100a and 100b of the differential amplifier 100 are forcedly brought into the same potential. The input terminal 100a of the differential amplifier 100 is supplied with a potential of an electrical connection point between the output terminal of the current mirror circuit composed of the transistors 41 and 22, and the memory cell MC, as described above. The "output terminal of the current mirror circuit" means a drain of the transistor 22.

As shown in FIG. 3, the reference-potential supply circuit 50 is configured by P-channel MOS transistors 51 and 52 connected in series between the power supply potential VDD and the source potential VSS, and a capacitive element 53. A gate and a drain of the transistor 51 are short-circuited, and thereby, potentials of the gate and the drain of the transistor 51 is stabled to a level (VREF1) obtained by subtracting a threshold value voltage of the transistor 51 from the power supply potential VDD. The level is used as the reference potential VREF1. In this way, the transistor 51 is used as a reference-potential generating circuit.

One end of the capacitive element 53 is connected to the input terminal 100b of the differential amplifier 100. Thereby, when the transistor 52 is turned on, the input terminal 100b of the differential amplifier 100 is supplied with a reference potential VREF2, and even after the transistor 52 is turned off, the level of the input terminal 100b of the differential amplifier 100 is kept at the reference potential VREF2 for a certain period of time. Substantially, the reference potentials VREF1 and VREF2 are the same in level. In this way, the transistor 52 is used as a switch circuit that supplies the reference potential VREF2. The other end of the capacitive element 53 is connected to the source potential VSS. As the capacitive element 53, a gate capacity obtained by short-circuiting the source and the drain of the MOS transistor can be used.

Figure 4:
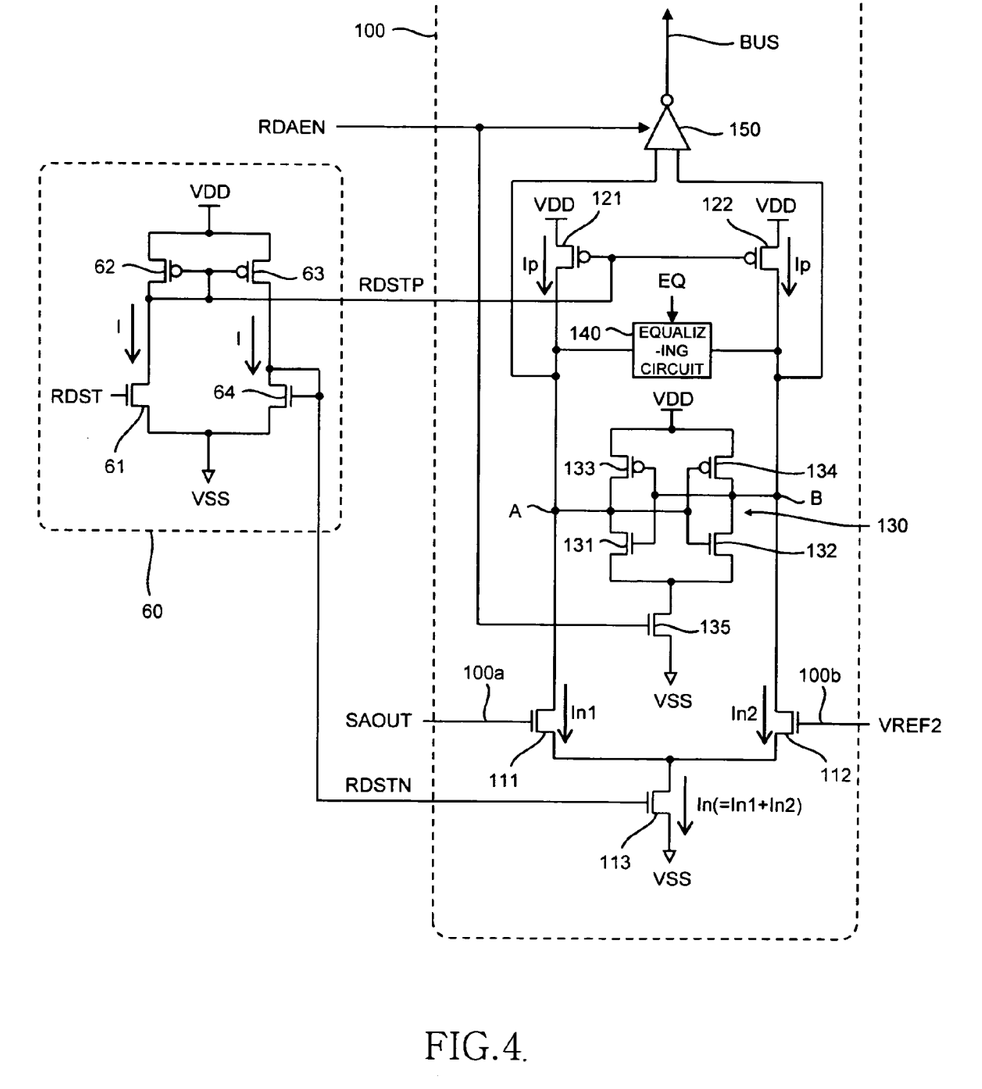
FIG. 4 is a circuit diagram of the differential amplifier 100 and the current control circuit 60.

FIG. 4 is a circuit diagram of the differential amplifier 100 and the current control circuit 60.

As shown in FIG. 4, the differential amplifier 100 is configured by: an N-channel MOS transistor 111 of which the gate electrode is the input terminal 100a; an N-channel MOS transistor 112 of which the gate electrode is the input terminal 100b; an N-channel MOS transistor 113 that is commonly connected to the sources of the transistors 111 and 112; a P-channel MOS transistor 121 that supplies a current to the transistor 111; a P-channel MOS transistor 122 that supplies a current to the transistor 112; a latch circuit 130 of which the one end is connected to a connection point A between the transistors 111 and 121 and the other end is connected to a connection point B between the transistors 112 and 122; an equalizing circuit 140 that short-circuits the connection points A and B in response to the equalizing signal EQ; and a tri-state buffer 150 that drives a data bus BUS based on a potential difference between the connection points A and B.

The latch circuit 130 is configured by transistors 131 to 134 that are flip-flop connected, and a transistor 135 that permits a latch operation. A gate of the transistor 135 and the tri-state buffer 150 are supplied with a differential-amplifier activating signal RDAEN. Thereby, when the differential-amplifier activating signal RDAEN is activated, the latch operation by the latch circuit 130 is performed, and also, read data is outputted to the data bus BUS.

On the other hand, the current control circuit 60 is configured by: an N-channel MOS transistor 61 that flows a constant current I in response to a start signal RDST; a P-channel MOS transistor 62 connected in series to the transistor 61; a P-channel MOS transistor 63 that is current-mirror connected for the P-channel MOS transistor 62; and an N-channel MOS transistor 64 connected in series to the transistor 63.

The transistor 62 is connected in series to the transistor 61, and thus, when the start signal RDST is activated, the constant current I flows to the transistor 62. The transistors 62 and 63 configure the current mirror circuit, and thus the constant current I also flows to the transistor 63. Further, the transistors 63 and 64 are connected in series, and thus the constant current I also flows to the transistor 64.

Gates of the transistors 121 and 122 included in the differential amplifier 100 are connected to a gate and a drain of the transistor 62 included in the current control circuit 60. Thus, a current mirror circuit in which the transistor 62 is an input transistor and the transistors 121 and 122 are output transistors is configured. Accordingly, in the transistors 121 and 122, a current Ip determined by the constant current I and a current mirror ratio flows.

Similarly, a gate of the transistor 113 included in the differential amplifier 100 is connected to a gate and a drain of the transistor 64 included in the current control circuit 60. Thus, a current mirror circuit in which the transistor 64 is an input transistor and the transistor 113 is an output transistor is configured. Accordingly, in the transistors 113, a current In determined by the constant current I and a current mirror ratio flows.

The circuit configuration of the current sensing circuit 10 according to the present embodiment is as described above. An operation of the current sensing circuit 10 according to the present embodiment is described next.

Figure 5:
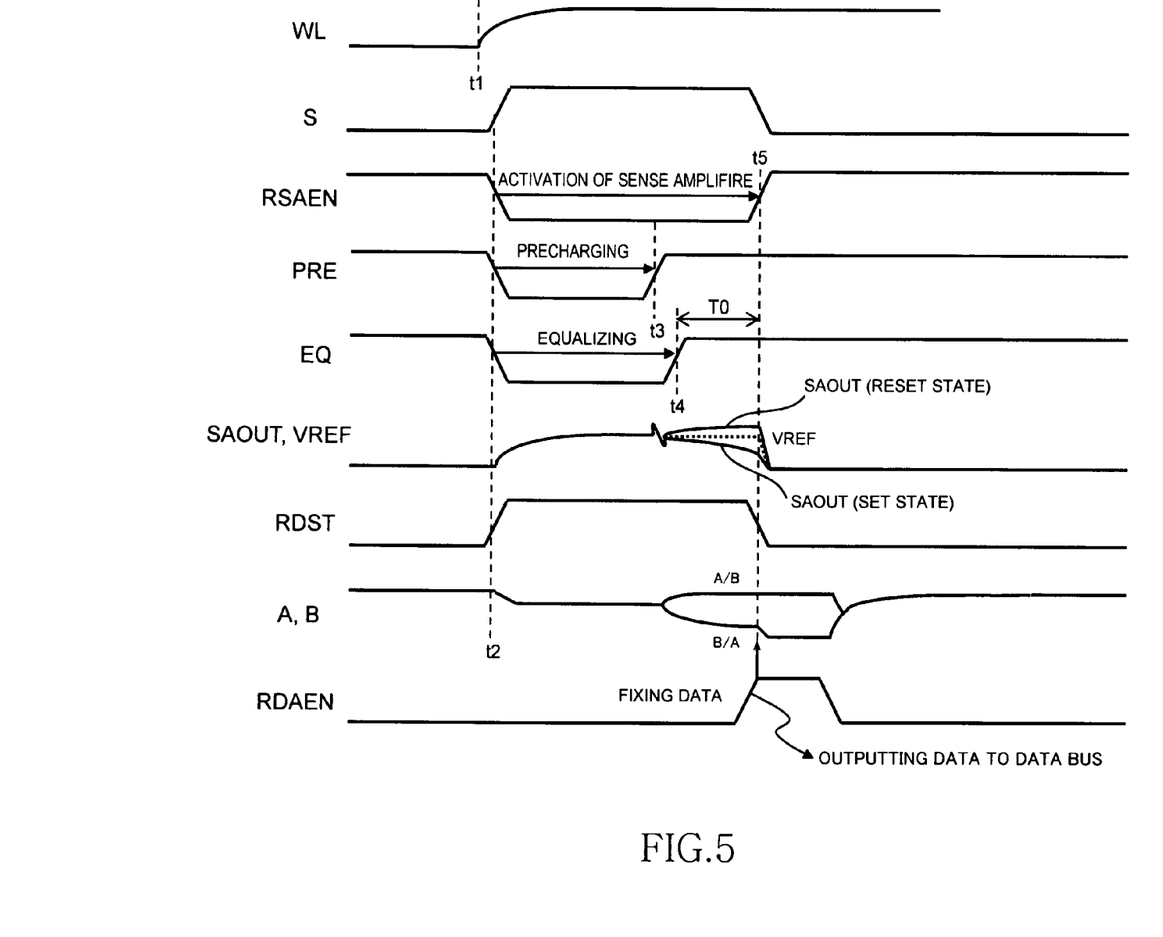
FIG. 5 is a timing chart for explaining the operation of the current sensing circuit 10.

FIG. 5 is a timing chart for explaining the operation of the current sensing circuit 10 according to the present embodiment.

As shown in FIG. 5, when a predetermined word line is selected at time t1, the transfer-switch selection signal S, the sense-amplifier activating signal RSAEN, the precharge signal PRE, the equalizing signal EQ, and the start signal RDST are activated at subsequent time t2. Thereby, the selected memory cell MC is connected to the transfer line TRL, and also, the transfer line TRL is precharged to the reference potential VREF1. At this time, the capacitive element 53 included in the reference-potential supply circuit 50 is also charged to the reference potential VREF2 via the transistor 52. Further, the equalizing circuit 24 is turned on, and as a result, the input terminals 100a and 100b of the differential amplifier 100 are brought into the same potential (VREF1=VREF2).

Thereby, the selected bit line is precharged via the transfer line TRL. However, as described by using FIG. 1, the transfer line TRL is shared by a plurality of memory mats MATs, and thus the parasitic capacitance is relatively large. As a result, the potential SAOUT of the input terminal 100a of the differential amplifier 100 gradually rises.

On the other hand, also in the current control circuit 60, as a result of the activation of the start signal RDST, the constant current I flows. Thus, the current Ip flows to the transistors 121 and 122 included in the differential amplifier 100, and the current In flows to the transistor 113. However, in this period, the potential SAOUT of the input terminal 100a and the potential VREF2 of the input terminal 100b are the same in value, and thus, a current In1 flowing to the transistor 111 and a current In2 flowing to the transistor 112 substantially match in value. By the equalizing circuit 140, the connection points A and B are kept at the same potential.

At time t3, the precharge signal PRE is inactivated, and the transistors 23 and 52 are turned off. Thereby, the precharge operation is completed, and a current supply to the transfer line TRL is performed only by the transistors 21 and 22. When the transistor 23 is turned off, the potential SAOUT of the input terminal 100a is temporarily disturbed by a coupling capacity (gate-drain capacity) of the transistor 23. However, in this period, the equalizing circuit 24 is turned on, and thus the fluctuation of SAOUT and VREF2 results in a common mode. Thus, there occurs no difference in value between the current In1 flowing to the transistor 111 and the current In2 flowing to the transistor 112. Also, when the transistor 52 is turned off, generating of the reference potential VREF2 is also stopped; however, the level is maintained by the capacitive element 53.

At time t4, the equalizing signal EQ is inactivated. Thereby, the input terminals 100a and 100b of the differential amplifier 100 are cut off, resulting in a sensing enabled state. As described above, the transistors 41 and 22 configure the current mirror circuit, and accordingly, the current flowing to the transistor 22 is the reference current Iref. In this case, a current flowing to the input terminal 100a of the differential amplifier 100 is defined by Iref-Icel, where Icel denotes a current flowing to the memory cell MC. Iref is the constant current, and thus, this means that by the current Icel flowing to the memory cell MC, the potential SAOUT of the input terminal 100a is determined.

Accordingly, when the phase-change memory device PC included in the memory cell MC is in an amorphous state (reset state), Icel is relatively small. Thus, the potential SAOUT rises and becomes higher than the potential VREF2 of the input terminal 100b that is a reference side. On the other hand, when the phase-change memory device PC included in the memory cell MC is in a crystalline state (set state), Icel is relatively large. Thus, the potential SAOUT decreases and becomes lower than the potential VREF2 of the input terminal 100b that is a reference side.

In this way, when there occurs an advantageous potential difference between SAOUT and VREF2, there occurs a difference in value between the current In1 flowing to the transistor 111 and the current In2 flowing to the transistor 112. As a result, there occurs a large potential difference between the connection point A and the connection point B within the differential amplifier 100.

Thereafter, at time t5, the transfer switch TSW is turned off, and the reading operation from the memory cell MC is ended. Simultaneously, the sense-amplifier activating signal RSAEN and the start signal RDST are inactivated, and the differential-amplifier activating signal RDAEN is activated. Thereby, the levels of the connection points A and B within the differential amplifier 100 are latched to the latch circuit 130, and outputted to the data bus BUS via the tri-state buffer 150.

Thus, in the current sensing circuit 10 according to the present embodiment, the equalizing circuit 24 is turned on during the precharge operation, and after the precharge operation is completed (time t3), the equalizing circuit 24 is turned off (time t4). Thus, at time t4 when the sensing operation starts, it becomes possible to bring the potential SAOUT of the input terminal 100a and the potential VREF2 of the input terminal 100b into the same potential. As a result, after the sensing operation is started, there promptly occurs an advantageous potential difference between SAOUT and VREF2, and thus a period T0 that is a sensing period can be shortened.

Further, in the present embodiment, the operation current of the differential amplifier 100 is controlled by the current control circuit 60, and thus the potential difference between SAOUT and VREF2 can be sensed highly sensitively. That is, even when there occurs a difference between a driving capability of the P-channel MOS transistor and that of the N-channel MOS transistor due to a process variation or the like, the difference in driving capability is corrected in a self-aligned manner.

For example, when the driving capability of the P-channel MOS transistor is high and that of the N-channel MOS transistor is low due to a process variation, an amount of the constant current I flowing to the transistor 62 is larger than a design value. Thereby, the potentials of the reference potentials RDSTP and RDSTN are larger than the design value, and thus, a gate-source voltage of the transistors 121 and 122 configuring the differential amplifier 100 is lower than the design value and a gate-source voltage of the transistor 113 is higher than the design value. As a result, the current Ip and the current In are converged to a substantially approximate design value. Even in the opposite case, i.e., when the driving capability of the P-channel MOS transistor is low and that of the N-channel MOS transistor is high, the current Ip and the current In are similarly converged to an approximate design value.

In contrast thereto, when the potential applied to the gates of the transistors 113, 121, and 122 during activation is fixed, if there occurs a difference in driving capability due to a process variation or the like, the potentials of the connection points A and B are sometimes fixed to near VDD or near VSS irrespective of the potential difference between SAOUT and VREF2. In such a case, the sensing operation is disabled, and thus the latch circuit 130 cannot latch the read data.

However, in the present embodiment, such a problem does not occur. The difference in driving capability by the process variation is offset, and thus a correct sensing operation can be performed. Further, in the present embodiment, the differential amplifier 100 has the equalizing circuit 140, and thus the potentials of the connection points A and B before the sensing operation match. Due to this, a higher speed and more accurate sensing operation can be performed.

Further, in the present embodiment, the level of the reference potential VREF2 that is a reference side is maintained by the capacitive element 53, and as a result, it is possible to greatly diminish the consumption power of the reference-potential supply circuit 50. Besides, the capacitive element 53 and the memory cell MC are connected to the same source potential VSS, and thus, even when the source potential VSS fluctuates, the fluctuation appearing in SAOUT and VREF2 is in a common mode. As a result, even when the source potential VSS fluctuates, the sensing operation can be correctly performed.

A preferred layout of the semiconductor memory device according to the present embodiment is explained next.

Figure 6:
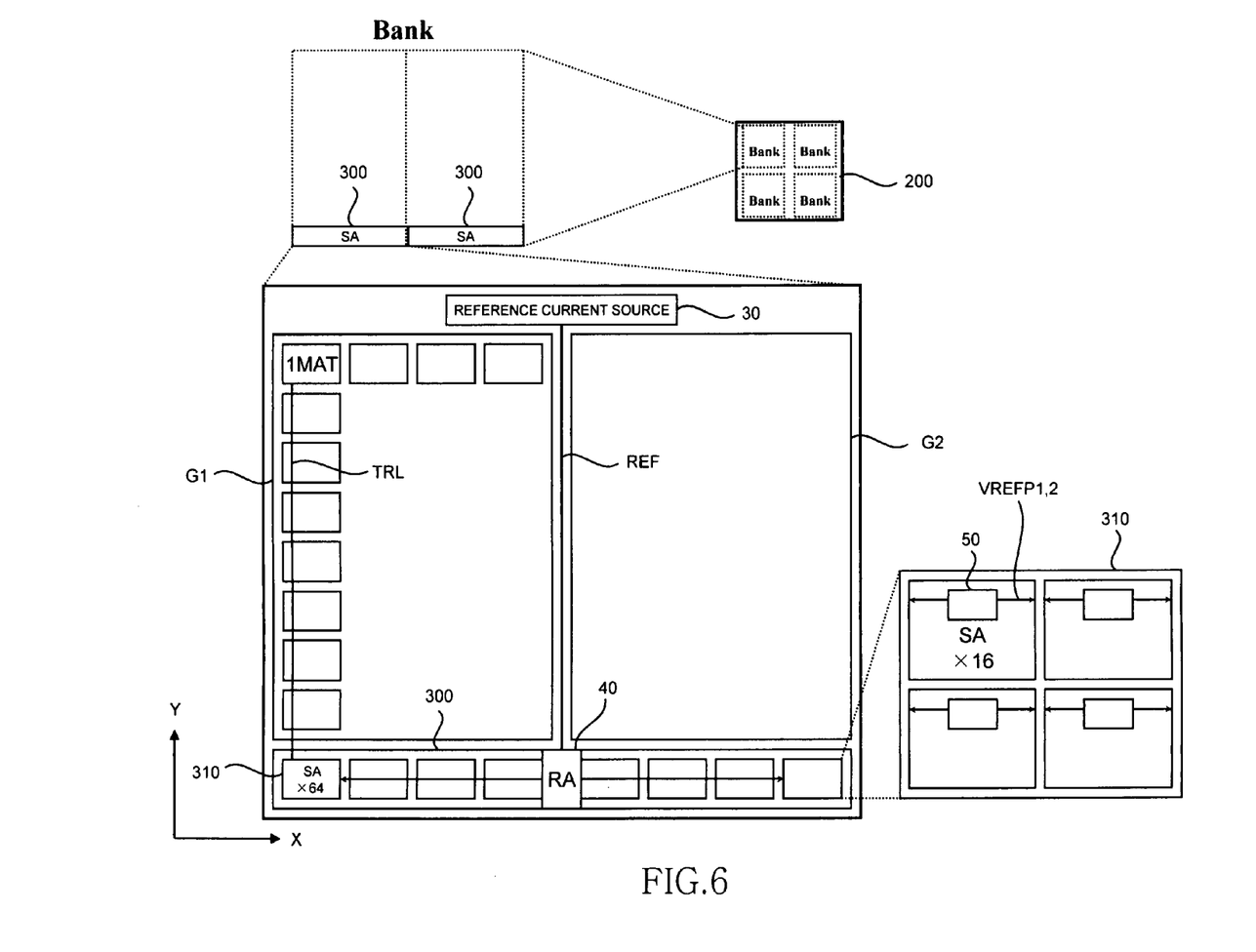
FIG. 6 is a schematic diagram for explaining the preferred layout of the semiconductor memory device indicated in FIG. 1.

FIG. 6 is a schematic diagram for explaining the preferred layout of the semiconductor memory device according to the present embodiment.

In an example shown in FIG. 6, four banks are arranged in an IC chip 200 configuring the semiconductor memory device, and 64 memory mats MATs are included for each ½ bank. The 64 memory mats MATs are classified into two memory mat groups G1 and G2, and the memory mat groups G1 and G2 are located adjacently in an X-direction shown in FIG. 6. Each of the memory mat groups G1 and G2 is composed of a total of 32 memory mats MATs, i.e., four memory mats MATs in an X-direction and eight memory mats MATs in a Y-direction.

In one end (end on a rim side of the chip) in a Y-direction of the memory mat groups G1 and G2, the reference current source 30 is arranged, and in the other end (on the center side of the chip) in a Y-direction, a sense amplifier column 300 and the reference amplifier 40 are arranged. A reference wiring REF connecting the reference current source 30 and the reference amplifier 40 extends in a Y-direction, and is located between the memory mat groups G1 and G2.

The sense amplifier column 300 is composed of eight sense amplifier groups 310 arranged for each column of the memory mat MAT. As shown in FIG. 6, one sense amplifier group 310 includes 64 sense amplifiers 20. Accordingly, there are 512 sense amplifiers 20 for each ½ bank. To the 512 sense amplifiers 20, the reference current source 30 and the reference amplifier 40 are allocated one each.

The reason that for a large number of sense amplifiers 20, one reference current source 30 and reference amplifier 40 can be shared is that the reference potential VREFP generated by the current mirror circuit is not used as the reference potential, as described by using FIG. 3. In the present embodiment, the reference potential VREFP is supplied only to the gate of the transistor 22 and there is little factor for fluctuating the reference potential VREFP. Thus, for a large number of sense amplifiers 20, one reference current source 30 and reference amplifier 40 can be shared. Further, the reference amplifier 40 is not required to have a high driving capability, and as a result, even when the current value of the reference current Iref is set sufficiently small, the reference potential VREFP can be stabled. Accordingly, the power consumption can be reduced.

To the 64 sense amplifiers 20 included in the sense amplifier group 310, one reference-potential supply circuit 50 is allocated to each 16 sense amplifiers 20. This is so allocated for the reason that the reference potential VREF2 generated by the reference-potential supply circuit 50 is maintained by the capacitive element 53, and thus, when too many (for example, 512) sense amplifiers 20 are connected to one reference-potential supply circuit 50, the level of the reference potential VREF2 can be fluctuated. This problem can be alleviated to a certain extent by setting the capacitance of the capacitive element 53 larger. However, when a distance between the reference-potential supply circuit 50 and the sense amplifier 20 is far, even if the capacitance of the capacitive element 53 is large, the reference potential VREF2 applied to the sense amplifier 20 is deviated. On the other hand, when the reference-potential supply circuit 50 is allocated to each of the individual sense amplifiers 20, an overall circuit scale has to be larger.

From this point of view, in the present embodiment, one reference-potential supply circuit 50 is allocated to 16 sense amplifiers 20. As a result, the stabilization of the reference potential VREF2 is allowed while restraining an increase in circuit scale. Although the number of sense amplifiers shared by one reference-potential supply circuit 50 is not particularly limited, it is preferable to set to two or more and to a number smaller than that of sense amplifiers (in this example, 512) shared by one reference current source 30 and reference amplifier 40. Further, it is more preferable that the number is the same as the number of sense amplifiers (in this example, 64) configuring the sense amplifier group 310, or equal to or less than that number. It is particularly preferable that the number is ½ to ⅛ the number of sense amplifiers configuring the sense amplifier group 310.

It is also preferable that one current control circuit 60 is allocated to 16 sense amplifiers 20. Due to this, an increase in circuit scale can be prevented. It is preferable that the 16 sense amplifiers 20 sharing the same current control circuit 60 are the same as the 16 sense amplifiers 20 sharing the same reference-potential supply circuit 50.

Another embodiment of the present invention is explained next.

Figure 7:
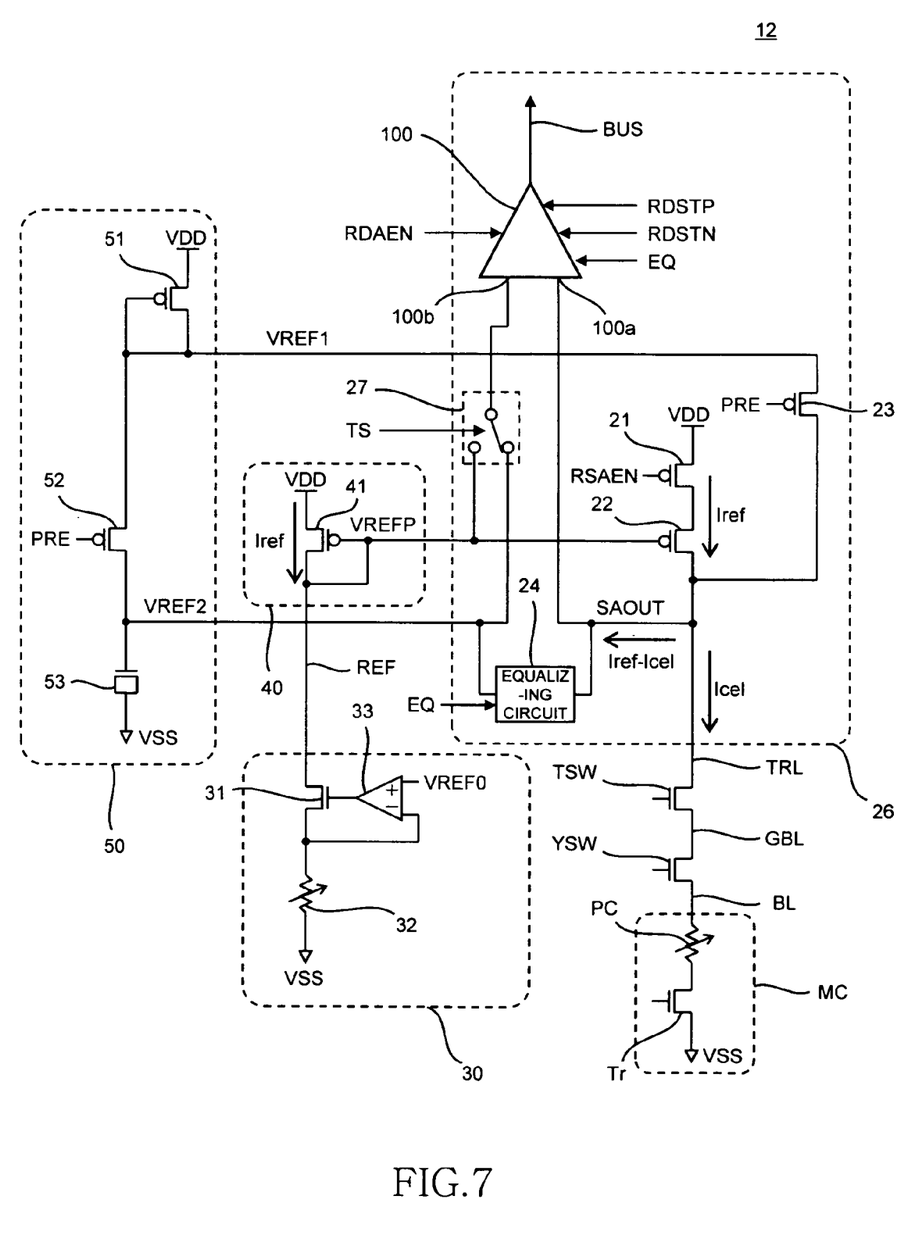
FIG. 7 is a circuit diagram showing a configuration of main parts of a current sensing circuit 12 according to another embodiment of the present invention.

FIG. 7 is a circuit diagram showing a configuration of main parts of a current sensing circuit 12 according to another embodiment of the present invention, and shows a portion composed of a sense amplifier 26, the reference current source 30, the reference amplifier 40, and the reference-potential supply circuit 50.

As shown in FIG. 7, the current sensing circuit 12 according to the present embodiment differs from the current sensing circuit 10 shown in FIG. 3 in that the sense amplifier 20 is replaced by the sense amplifier 26. Other features of the current sensing circuit 12 are the same as those of the current sensing circuit 10, and thus like elements are denoted by like reference numerals, and redundant explanations thereof will be omitted.

The sense amplifier 26 includes a switching circuit 27 connected to the input terminal 100b of the differential amplifier 100. The switching circuit 27 connects the input terminal 100b of the differential amplifier 100 to the input terminal of the capacitive element 53 or the current mirror circuit in response to a test mode signal TS. The "input terminal of the current mirror circuit" is a gate and a drain of the transistor 41.

According to such a configuration, the switching circuit 27 connects the input terminal 100b of the differential amplifier 100 to the capacitive element 53 during a normal operation, and connects the input terminal 100b of the differential amplifier 100 to the input terminal of the current mirror circuit during a test operation. The reason that the input terminal 100b of the differential amplifier 100 is connected to the input terminal of the current mirror circuit during a test operation is explained below.

At the time of designing, evaluating, and manufacturing a semiconductor memory device, various types of characteristic evaluations are conducted. As one of the characteristic evaluations, a characteristic evaluation in which a resistance of the memory cell MC is mega Ω order is sometimes conducted. In such a characteristic evaluation, a fluctuation of SAOUT is gradual, and thus it is necessary to set the sensing period (T0 shown in FIG. 5) sufficiently long, as compared to a normal operation time. At this time, when the input terminal 100b of the differential amplifier 100 is connected to the reference-potential supply circuit 50, the reference potential VREF2 that is maintained by the capacitive element 53 is decreased by leakage, and thus a correct evaluation cannot be performed. In such a case, when the input terminal 100b of the differential amplifier 100 is connected to the input terminal of the current mirror circuit by using the switching circuit 27, it becomes possible to maintain the potential of the reference potential VREFP that is a reference side by the drive of the current mirror circuit.

It is apparent that the present invention is not limited to the above embodiments, but may be modified and changed without departing from the scope and spirit of the invention.

For example, in the above embodiments, the present invention is applied to the PRAM. However, the present invention is not only targeted therefor, but also can be applied to other types of semiconductor memory devices. Accordingly, it poses no problem that, instead of the phase-change memory device PC included in the memory cell MC, other memory devices (for example, a variable resistance element used for the RRAM) can be used. It is not essential that the memory cell is non-volatile, and it can be volatile.

Further, it is not essential that the memory cell is a variable resistance element. However, the memory cell using the variable resistance element takes a longer time for the sensing operation as compared to a DRAM cell or the like, and thus the present invention is very preferably applied to a semiconductor memory device using such a memory cell. As described above, the reason for this is that in such a type of semiconductor memory device, the circuit scale of the sense amplifier becomes considerably large, and thus the arrangement of a sense amplifier for each bit line, which is a case of a DRAM, is not practical.

In the above embodiments, the reference-potential supply circuit 50 is used to generate the reference potential VREF2, and the generated reference potential VREF2 is supplied to the input terminal 100b of the differential amplifier 100. However, the present invention is not limited thereto. The reference potential VREFP generated by the current mirror circuit composed of the transistors 41 and 22 can be supplied to the input terminal 100b of the differential amplifier 100. However, according to the configuration of the above embodiments, because the reference current Iref can be set small, the power consumption can be reduced. It is also possible to be configured such that the transistor 52 and the capacitive element 53 are deleted, and the reference potential VREF2 is supplied from the transistor 51 all the time to the input terminal 100b of the differential amplifier 100.

In the above embodiments, the capacitive element 53 is used to hold the potential of the reference potential VREF2. However, the present invention is not limited thereto. For example, instead of the capacitive element 53, a constant current can be used. Even so, according to the configuration of the above embodiments, the power consumption can be reduced.

The use of the current control circuit 60 is not essential in the present invention, and the potential to be applied to the gates of the transistors 113, 121, and 122 during activation can be fixed. When the current control circuit 60 is used, the driving capability difference due to a process variation or the like is corrected in a self-aligned manner. Thus, a correct sensing operation can be performed.

In the above embodiments, the equalizing circuit 140 is arranged within the differential amplifier 100. However, in the present invention, it is not essential to arrange the equalizing circuit 140. Note that when the equalizing circuit 140 is arranged within the differential amplifier 100, the potentials of the connection points A and B before the sensing operation are matched, and thus a high-speed and correct sensing operation can be performed.

In the above embodiments, one transfer line TRL and sense amplifier 20 (26) are allocated to each I/O. However, two or more transfer lines TRL and sense amplifiers 20 (26) can be allocated to each I/O and these components can be operated in parallel. According to this, a reading cycle can be shortened.

Further, in the above embodiments, the polarity of each field effect transistor is thus created. However, it is possible to configure a circuit in which the polarities of the field effect transistors are all inverted. In this case, a relation between a power source potential and grounding or the like and the polarity of the control signal are also inverted.

Further, any types of transistor can be used as long as it is a field effect transistor (FET). Other than MOS (Metal Oxide Semiconductor), the present invention can be applied to various FETs such as an MIS (Metal-Insulator Semiconductor) transistor. The N-channel MOS transistor is a representative example of a transistor of a first conductivity type and the P-channel MOS transistor is a representative example of a transistor of a second conductivity type.

What is claimed is:

1. A current sensing circuit comprising:
a current mirror circuit having an input terminal and an output terminal, the input terminal of the current mirror circuit being connected to a reference current source;
a differential amplifier having a first input terminal and a second input terminal, the first input terminal of the differential amplifier being supplied with a potential of an electrical connection point between the output terminal of the current mirror circuit and a memory cell, and the second input terminal of the differential amplifier being supplied with a reference potential; and
an equalizing circuit that short-circuits the first and second input terminals of the differential amplifier in response to an equalizing signal.

2. The current sensing circuit as claimed in claim 1, further comprising a reference-potential supply circuit that is provided independently of the current mirror circuit and supplies the reference potential, wherein
the second input terminal of the differential amplifier is electrically connected to the reference-potential supply circuit.

3. The current sensing circuit as claimed in claim 2, further comprising a precharge circuit that supplies the reference potential to the first input terminal of the differential amplifier in response to a precharge signal, wherein the reference-potential supply circuit includes a reference-potential generating circuit that generates the reference potential and a switch circuit that supplies the reference potential to the second input terminal of the differential amplifier in response to the precharge signal.

4. The current sensing circuit as claimed in claim 2, wherein the reference-potential supply circuit includes a capacitive element having first and second electrodes, the first electrode of the capacitive element is connected to the second input terminal of the differential amplifier.

5. The current sensing circuit as claimed in claim 4, wherein the second electrode of the capacitive element and a source of the memory cell are connected to a same power source potential.

6. The current sensing circuit as claimed in claim 4, further comprising a switching circuit that connects the second input terminal of the differential amplifier to either the first electrode of the capacitive element or the input terminal of the current mirror circuit.

7. The current sensing circuit as claimed in claim 6, wherein the switching circuit connects the second input terminal of the differential amplifier to the first electrode of the capacitive element during a normal operation, and connects the second input terminal of the differential amplifier to the input terminal of the current mirror circuit during a test operation.

8. A semiconductor memory device comprising:
a plurality of memory cells;
a reference current source supplying a first reference current;
a reference amplifier generating a first reference potential based on the first reference current;
a plurality of sense amplifier each including a transistor, a differential amplifier, and an equalizing circuit, wherein
the transistor flows a second reference current based on the first reference potential,
the differential amplifier has a first input terminal and a second input terminal,
the first input terminal of the differential amplifier is supplied with a potential depending on a relationship between a cell current flowing to a selected one of the memory cells and the second reference current flowing to the transistor,
the second input terminal of the differential amplifier is supplied with a second reference potential,
the equalizing circuit short-circuits the first and second input terminals of the differential amplifier in response to an equalizing signal.

9. The semiconductor memory device as claimed in claim 8, further comprising at least one reference-potential supply circuit that supplies the second reference potential.

10. The semiconductor memory device as claimed in claim 9, wherein a number of the sense amplifiers assigned to one reference current source is larger than a number of the sense amplifiers assigned to one reference-potential supply circuit.

11. The semiconductor memory device as claimed in claim 9, wherein the reference-potential supply circuit is provided independently of a current mirror circuit configured by the reference amplifier and the transistor.

12. The semiconductor memory device as claimed in claim 9, wherein each sense amplifier further includes a precharge circuit that supplies the second reference potential to the first input terminal of the differential amplifier in response to a precharge signal, wherein
the reference-potential supply circuit includes a reference-potential generating circuit that generates the second reference potential and a switch circuit that supplies the second reference potential to the second input terminal of the differential amplifier in response to the precharge signal.

13. The semiconductor memory device as claimed in claim 9, wherein the reference-potential supply circuit includes a capacitive element having first and second electrodes, the first electrode of the capacitive element is connected to the second input terminal of the differential amplifier.

14. The semiconductor memory device as claimed in claim 13, wherein the second electrode of the capacitive element and a source of the memory cells are connected to a same power source potential.

15. The semiconductor memory device as claimed in claim 13, wherein each sense amplifier further includes a switching circuit that connects the second input terminal of the differential amplifier to either the first electrode of the capacitive element or a reference line supplied with the first reference potential.

16. The semiconductor memory device as claimed in claim 15, wherein the switching circuit connects the second input terminal of the differential amplifier to the first electrode of the capacitive element during a normal operation, and connects the second input terminal of the differential amplifier to the reference line during a test operation.

17. The semiconductor memory device as claimed in claim 8, wherein the differential amplifier includes:
a first field effect transistor of a first conductive type having a gate electrode that serves as the first input terminal;
a second field effect transistor of the first conductive type having a gate electrode that serves as the second input terminal;
a third field effect transistor of the first conductive type, commonly connected to sources of the first and second field effect transistors;
a fourth field effect transistor of a second conductive type that supplies a current to the first field effect transistor;
a fifth field effect transistor of the second conductive type that supplies a current to the second field effect transistor; and
a latch circuit having first and second I/O nodes, the first I/O node being connected to a connection point between the first field effect transistor and the fourth field effect transistor, and the second I/O node being connected to a connection point between the second field effect transistor and the fifth field effect transistor.

18. The semiconductor memory device as claimed in claim 17, further comprising at least one current control circuit, each current control circuit including:
a sixth field effect transistor of the second conductive type to which a constant current is supplied;
a seventh field effect transistor of the second conductive type, which is current-mirror connected to the sixth field effect transistor; and
an eighth field effect transistor of the first conductive type, connected in series to the seventh field effect transistor, wherein
gates of the fourth to seventh field effect transistors are commonly connected, and gates of the third and eighth field effect transistors are commonly connected.

19. The semiconductor memory device as claimed in claim 18, wherein two or more sense amplifiers are assigned to one current control circuit.

20. A semiconductor memory device comprising:
a memory cell in which a resistance value differs depending on stored data;
a bit line connected to the memory cell; and a current sensing circuit that reads data stored in the memory cell via the bit line, wherein the current sensing circuit includes:

a reference current source that flows a reference current;

a current mirror circuit having an input terminal and an output terminal, the input terminal of the current mirror circuit is connected to the reference current source;

a differential amplifier having a first input terminal and a second input terminal, the first input terminal of the differential amplifier being supplied with a potential of an electrical connection point between the output terminal of the current mirror circuit and the memory cell, and the second input terminal of the differential amplifier being supplied with a reference potential; and an equalizing circuit that short-circuits the first and second input terminals of the differential amplifier in response to an equalizing signal.

* * * * *